United States Patent
Nemoto et al.

(10) Patent No.: US 10,971,670 B2
(45) Date of Patent: Apr. 6, 2021

(54) THERMOELECTRIC CONVERSION DEVICE

(71) Applicant: NIPPON THERMOSTAT CO., LTD., Tokyo (JP)

(72) Inventors: Takashi Nemoto, Tokyo (JP); Masayoshi Shibata, Tokyo (JP); Satoshi Ito, Tokyo (JP)

(73) Assignee: NIPPON THERMOSTAT CO., LTD., Tokyo (JP)

( * ) Notice: Subject to any disclaimer, the term of this patent is extended or adjusted under 35 U.S.C. 154(b) by 0 days.

(21) Appl. No.: 16/819,188

(22) Filed: Mar. 16, 2020

(65) Prior Publication Data

US 2020/0220062 A1 Jul. 9, 2020

Related U.S. Application Data

(63) Continuation of application No. PCT/JP2018/024532, filed on Jun. 28, 2018.

(30) Foreign Application Priority Data

Oct. 23, 2017 (JP) .............................. JP2017-204638

(51) Int. Cl.
*H01L 35/06* (2006.01)
*F01N 5/02* (2006.01)
(Continued)

(52) U.S. Cl.
CPC .............. *H01L 35/06* (2013.01); *F01N 5/025* (2013.01); *F25B 21/02* (2013.01); *H01L 35/30* (2013.01); *H01L 35/32* (2013.01)

(58) Field of Classification Search
CPC ......... H01L 35/06; H01L 35/30; H01L 35/32; F01N 5/025; F25B 21/02; H02N 11/00;
(Continued)

(56) References Cited

U.S. PATENT DOCUMENTS 3,377,206 A * 4/1968 Emeis ................... H01L 35/06
136/212
7,628,617 B2 * 12/2009 Brown ............... H01R 13/2407
439/66

(Continued)

FOREIGN PATENT DOCUMENTS

JP 2001053342 A 2/2001
JP 2005302851 A 10/2005
(Continued)

OTHER PUBLICATIONS

International Search Report (ISR) for Application No. PCT/JP2018/024532 dated Jun. 28, 2018.
(Continued)

*Primary Examiner* — Angelo Trivisonno
(74) *Attorney, Agent, or Firm* — Isshiki International Law Office; Joseph P. Farrar, Esq.

(57) ABSTRACT

A thermoelectric conversion device including a plurality of first electrodes; a plurality of thermoelectric conversion elements, each having one end electrically connected to each of the first electrodes; a plurality of second electrodes, to which another end of each of the thermoelectric conversion elements is electrically connected; a hot-side heat exchanger connected to the first electrodes; and a cold-side heat exchanger connected to the second electrodes. Multiple springs are disposed in an interior of one of the hot-side heat exchanger and the cold-side heat exchanger at portions connected to either the first electrodes or the second electrodes, such that one spring is disposed so as to bias one thermoelectric conversion element. The one exchanger is provided with a transfer portion capable of transmitting to one thermoelectric conversion element a biasing force of one spring at a portion connected to the first electrode or the second electrode.

3 Claims, 4 Drawing Sheets

(51) Int. Cl.
*F25B 21/02* (2006.01)
*H01L 35/30* (2006.01)
*H01L 35/32* (2006.01)

(58) Field of Classification Search
CPC .. H01R 13/2407; H05K 3/326; H05K 3/4092; H05K 2201/0311
See application file for complete search history.

(56) References Cited

U.S. PATENT DOCUMENTS

2005/0287843 A1* 12/2005 Tsukamoto ............ H05K 3/326
439/76.2
2010/0288325 A1 11/2010 Takahashi
2014/0261608 A1* 9/2014 Wang ..................... H01L 35/04
136/224

FOREIGN PATENT DOCUMENTS

| JP | 2009176919 A | 8/2009 |
| JP | 4834986 B2 | 12/2011 |
| JP | 2013211470 A | 10/2013 |
| JP | 2014075542 A | 4/2014 |

OTHER PUBLICATIONS

Translation of the ISR for Application No. PCT/JP2018/024532 dated Jun. 28, 2018.
Written Opinion of the International Search Authority for Application No. PCT/JP2018/024532 dated Jun. 28, 2018.

* cited by examiner

THERMOELECTRIC CONVERSION DEVICE

CROSS-REFERENCE TO RELATED APPLICATION

This patent application is a continuation application of International Patent Application No. PCT/JP2018/024532 filed Jun. 28, 2018, which claims priority to Japanese Patent Application No. 2017-204638 filed Oct. 23, 2017, the entire disclosures of these applications being hereby incorporated herein by reference.

BACKGROUND

Technical Field

Embodiments of the present disclosure relate to a thermoelectric conversion device for generating electric power using the Seebeck effect, or performing cooling and heating using the Peltier effect.

Related Art

Conventionally, a thermoelectric conversion module in which a plurality of thermoelectric conversion elements each having an electrode at both ends is arranged on a base is known.

The conventional thermoelectric conversion module may be a so-called π-type thermoelectric conversion module, in which the two types of thermoelectric conversion elements, n-type thermoelectric conversion elements and p-type thermoelectric conversion elements, are alternated and electrically connected in series.

In the π-type thermoelectric conversion module, the high-temperature side of the thermoelectric conversion module does not contact a heating chamber inside a resistance heating furnace that is covered with heat insulating material, but is subjected to radiant heat transfer from the chamber. Therefore, the base insulator on the high-temperature side is omitted. It should be noted that, in a case in which the high-temperature side of the thermoelectric conversion module does contact the heating chamber in the resistance heating furnace, the base insulator is provided.

Also known is a so-called unileg-type thermoelectric conversion module constituted by only one type of thermoelectric conversion element, n-type or p-type.

The unileg-type thermoelectric conversion module has a connecting portion that integrally and electrically connects one electrode of a thermoelectric conversion element with the other electrode of an adjacent thermoelectric conversion element in series to form a U-shaped connector constituted by the electrodes and the connecting portion. This U-shaped connector is formed by bending a metal plate. When manufacturing the thermoelectric conversion module, multiple U-shaped connectors are first fixed to the base, after which the thermoelectric conversion elements are pushed into the U-shaped connector from the side and inserted between the two electrodes, and thereby connected to the connector.

SUMMARY

Problem to be Solved

In order to convert thermal energy to electrical energy efficiently, a thermoelectric conversion device may be configured by contacting a hot-side heat exchanger and a cold-side heat exchanger against the thermoelectric conversion module. In this thermoelectric conversion device, it is important for the thermoelectric conversion module to be tightly connected to the hot-side heat exchanger and the cold-side heat exchanger in order to properly convert heat and electricity. However, in the conventional thermoelectric conversion module, tolerances of individual components, differences in thermal expansion between thermoelectric conversion elements, and substantial variations in the height of the thermoelectric conversion element due to brazing during assembly are such that in some of the thermoelectric conversion elements heat cannot be properly transmitted between the hot-side heat exchanger and the cold-side heat exchanger and it has been difficult to efficiently convert thermal energy to electrical energy. Also, due to the tolerances of individual parts and substantial variations in height due to brazing during assembly, stress may be concentrated at portions where the height of the thermoelectric conversion element becomes large in the spring pressing direction, and there is a risk that the thermoelectric conversion module may be damaged due to excessive stress on the connecting portions of the thermoelectric conversion elements due to differences in thermal expansion between the thermoelectric conversion elements.

In view of the above, the present disclosure has as its object to provide a high-durability thermoelectric conversion device that can efficiently convert heat and electricity.

Solution

In order to achieve the above object, the present disclosure provides an improved thermoelectric conversion device that includes a plurality of first electrodes; a plurality of thermoelectric conversion elements, each having one end electrically connected to each of the first electrodes; a plurality of second electrodes, to which another end of each of the thermoelectric conversion elements is electrically connected; a hot-side heat exchanger connected to the first electrodes; and a cold-side heat exchanger, wherein a plurality of springs is disposed in an interior of one of the hot-side heat exchanger and the cold-side heat exchanger at portions connected to either the first electrode or the second electrode, such that one spring is disposed so as to bias one thermoelectric conversion element, and the one exchanger is provided with a transfer portion capable of transmitting to one thermoelectric conversion element a biasing force of the one spring at a portion connected to the first electrode or the second electrode.

With the present disclosure, since a single spring biases one thermoelectric conversion element, variation in the height of the thermoelectric conversion element due to difference in thermal expansion is absorbed by the spring and each thermoelectric conversion element can be firmly connected between the hot-side heat exchanger and the cooling medium exchanger, so that thermal energy to electrical energy can be efficiently converted.

In the present disclosure, the plurality of springs is preferably formed by cutting and raising at a plurality of locations at a position corresponding to a single metal plate to the thermoelectric conversion element.

With such a configuration, a plurality of springs can be one component, and eliminating the need to place the springs in accordance with the positions of each of the thermoelectric conversion elements facilitates the manufacture of the thermoelectric conversion device.

In the present disclosure, preferably the plurality of springs cut and raised from a single metal plate is disposed within the one exchanger so that the thickness direction of the springs is orthogonal to the direction of flow of the medium through the one exchanger. With such a configuration, it is possible to prevent the plurality of springs from becoming an impediment to the flow of the medium.

In the present disclosure, preferably one exchanger is the cold-side heat exchanger. Since a hot medium flows through the hot-side heat exchanger, if a spring is disposed in the hot-side heat exchanger, there is a risk that proper spring characteristics may not be obtained depending on the temperature of the flowing medium. Therefore, as described above, if one exchanger is a cold-side heat exchanger and a plurality of springs is arranged in the cold-side heat exchanger, the springs do not come into contact with the hot medium and the desired spring characteristics are maintained. Even when a hot medium is used, it is possible to firmly hold down the thermoelectric conversion element while absorbing variations in the height of the thermoelectric conversion elements with the springs, and to properly convert thermal energy to electrical energy.

In the present disclosure, in a case in which the cold-side heat exchanger and the transfer portion for transmitting a biasing force of the spring to the thermoelectric conversion elements are constructed of metal, preferably the transfer portion has a thickness that is thinner than the member that configures the cold-side heat exchanger.

If the transfer portion is formed of a material that is softer than the material of the cold-side heat exchanger, it is possible to configure the device so that the biasing force of one spring can be transmitted to only one thermoelectric conversion element even if the transfer portion is thicker than the cold-side heat exchanger.

However, if both the transfer portion and the cold-side heat exchanger are formed of metal and the thickness of the transfer portion is greater than the thickness of the metal plate constituting the cold-side heat exchanger, there is a risk that the transfer portion becomes unable to track the thermal expansion and variations of the thermoelectric conversion and the springs become unable to absorb the variations in height due to thermal expansion and the like of the thermoelectric conversion elements.

Therefore, as described above, by configuring the thermoelectric conversion elements so that the transfer portion is made thinner than the cold-side heat exchanger so as to be able to track variations in height between the cold-side heat exchanger and the hot-side heat exchanger, the springs can absorb the variations in height of the thermoelectric conversion elements, firmly hold the thermoelectric conversion elements in place, and properly convert thermal energy to electrical energy.

BRIEF DESCRIPTION OF THE DRAWINGS

A more complete appreciation of the disclosure and many of the attendant advantages thereof may be obtained as the same becomes better understood by reference to the following detailed description when considered in connection with the accompanying drawings, wherein.

DETAILED DESCRIPTION

Figure 1:
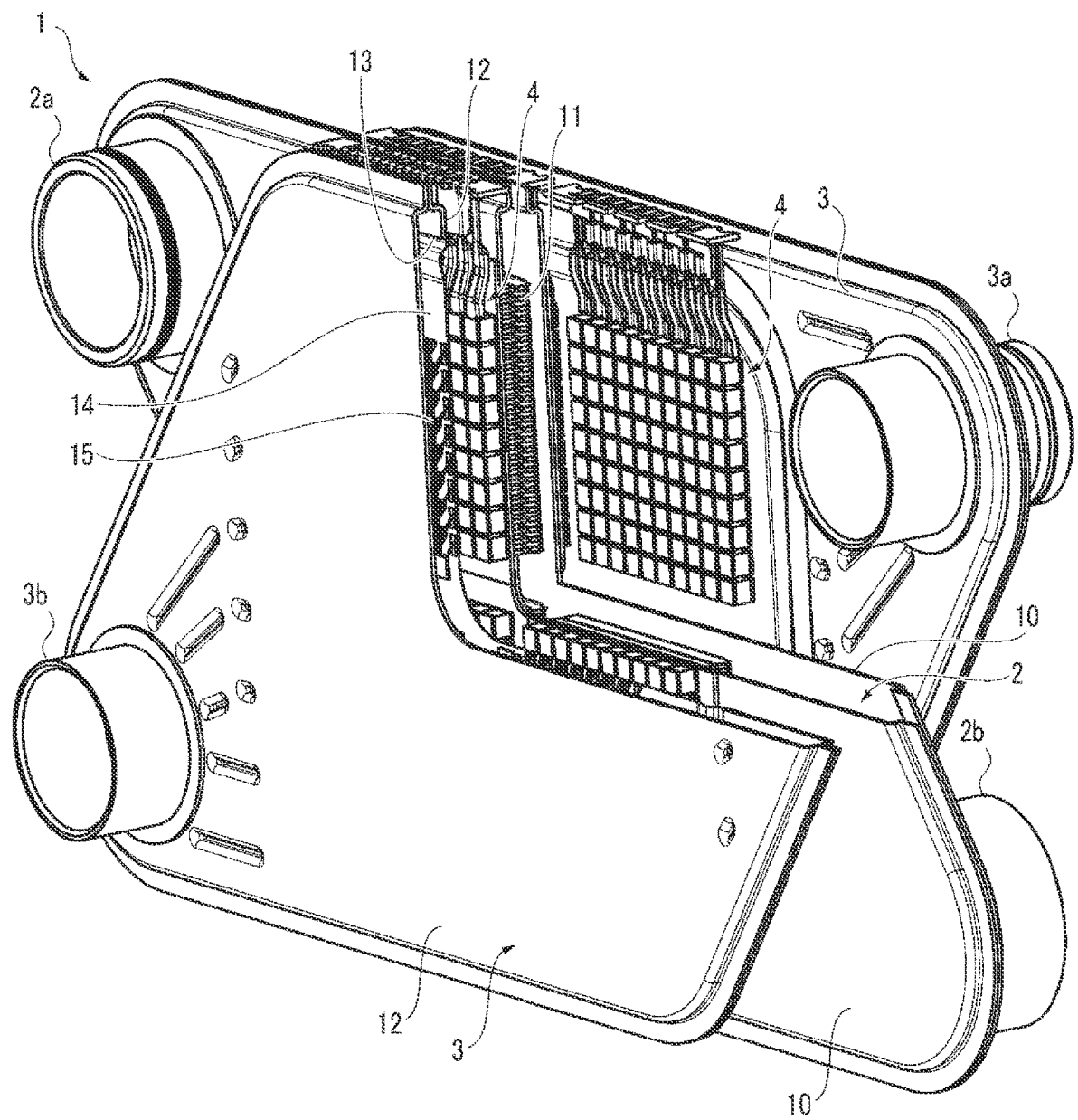
FIG. 1 is a partial perspective view illustrating a thermoelectric conversion device according to an embodiment of the present disclosure.

In describing embodiments illustrated in the drawings, specific terminology is employed for the sake of clarity. However, the disclosure of this patent specification is not intended to be limited to the specific terminology so selected and it is to be understood that each specific element includes all technical equivalents that have the same function, operate in a similar manner, and achieve similar results.

Although the embodiments are described with technical limitations with reference to the attached drawings, such description is not intended to limit the scope of the disclosure and all of the components or elements described in the embodiments of this disclosure are not necessarily indispensable. As used herein, the singular forms "a", "an", and "the" are intended to include the plural forms as well, unless the context clearly indicates otherwise.

Referring to the drawings, an embodiment of a thermoelectric conversion device of the present disclosure is described. As shown in FIG. 1, a thermoelectric conversion device 1 according to the present embodiment is mounted in an automobile, and includes a plate-shaped hot-side heat exchanger 2 through which exhaust gas discharged from an internal combustion engine of the automobile passes, plate-shaped cold-side heat exchangers 3 through which coolant to cool the internal combustion engine flows, and a thermoelectric conversion module 4 disposed so as to be sandwiched between the hot-side heat exchanger 2 and the cold-side heat exchangers 3.

The hot-side heat exchanger 2 is provided with a hot medium supply port 2a into which exhaust gas enters and a hot medium discharge port 2b through which exhaust gas is discharged. The cold-side heat exchangers 3 are provided with a cold medium supply port 3a through which coolant is supplied and a cold medium discharge port 3b through which coolant is discharged.

In the thermoelectric conversion device 1 of the present embodiment, two cold-side heat exchangers 3 are arranged so as to sandwich one hot-side heat exchanger 2 between them. Coolant as a cold medium is supplied and from one cold medium supply port 3a to two cold-side heat exchangers 3. The coolant passes through the two cold-side heat exchangers 3 and is discharged from the one cold medium outlet 3b. A plurality of hot-side heat exchangers 2 may be provided in the same manner. Moreover, the number of the cold-side heat exchangers 3 is not limited to two, and may be one or three or more.

Figure 2:
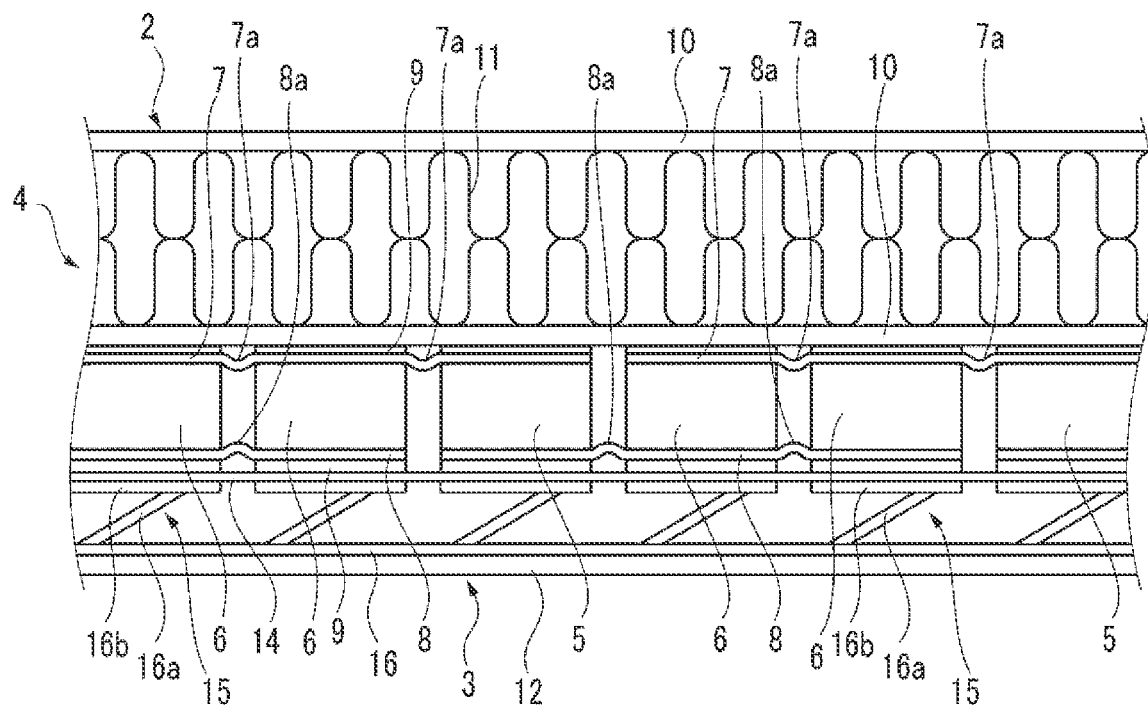
FIG. 2 is a cross-sectional view illustrating the thermoelectric conversion device according to the embodiment.

As shown in FIG. 2, the thermoelectric conversion module 4 includes n-type thermoelectric conversion elements 5, p-type thermoelectric conversion elements 6, first electrodes 7, and second electrodes 8. In the thermoelectric conversion module 4 of the present embodiment, since the p-type thermoelectric conversion elements 6 generally have a higher electrical resistance than the n-type thermoelectric conversion elements 5, two p-type thermoelectric conversion elements 6 are connected in parallel. In contrast, a pair of p-type thermoelectric conversion elements 6 and one n-type thermoelectric conversion element 5 are alternated such that one n-type thermoelectric conversion element 5 is connected in series to two p-type thermoelectric conversion elements 6.

The first electrode 7 is electrically connected to one end of the thermoelectric conversion elements 5, 6. Further, the first electrode 7 is fixed to the hot-side heat exchanger 2 via a plate-shaped insulator 9 by brazing or a thermosetting paste. The second electrode 8 is electrically connected to the other end of the thermoelectric conversion elements 5, 6. In addition, the second electrode 8 is in contact with the cold-side heat exchanger 3 via the plate-shaped insulator 9, but is not fixed by brazing or the like. It is preferable to interpose a heat transfer member such as grease between the second electrode 8 and the insulator 9 in order to improve heat transfer. The insulator 9 is fixed to the electrodes 7, 8 at each of the thermoelectric conversion elements 5, 6 by brazing or the like.

The ends of a total of three thermoelectric conversion elements, two of the p-type thermoelectric conversion elements 6 and one of the n-type thermoelectric conversion elements 5, are connected to one electrode 7, 8. The electrodes 7, 8 are provided with bent portions 7a, 8a located between the thermoelectric conversion elements 5, 6 to be connected. That is, two bent portions 7a, 8a are provided on one electrode 7, 8. The bent portions 7a, 8a absorb any differences in the heights of the thermoelectric conversion elements 5, 6 due to differences in thermal expansion between adjacent thermoelectric conversion elements 5, 6 and can thus prevent the electrodes 7, 8 from peeling off from the thermoelectric conversion elements 5, 6. The bent portions 7a, 8a are provided so as to protrude toward the thermoelectric conversion elements 5, 6. This prevents the bent portions 7a, 8a from interfering with the insulator 9 and preventing the insulator 9 from properly contacting the hot-side heat exchanger 2 and the cold-side heat exchanger 3, and also functions to position the thermoelectric conversion elements 5, 6 when joining them together.

The hot-side heat exchanger 2 is configured such that two metal plates 10, 10 are placed facing each other with a space therebetween. Corrugated fins 11 as thermal conductivity improvement members are provided between two metal plates 10, 10. By providing the corrugated fins 11, the heat of the exhaust gas flowing in the hot-side heat exchanger 2 can be efficiently transmitted to the thermoelectric conversion elements 5, 6.

Each cold-side heat exchanger 3 is configured such that two metal plates 12, 12 are placed facing each other with a space therebetween. The coolant as a cold medium flows in the space between the two metal plates 12, 12. Of the two metal plates 12, 12, the metal plate 12 on the thermoelectric conversion module 4 side is provided with a rectangular cutout hole 13 and this metal plate 12 is provided with a thin plate-shaped (foil-shaped, sheet-shaped) transfer portion 14 made of aluminum so as to cover the cutout hole 13. The transfer portion 14 is formed thinner than the plate thickness of the cold-side heat exchanger 3 made of metal. Further, springs 15 are disposed in the cold-side heat exchanger 3. Note that the material of the transfer portion 14 is not limited to aluminum, and any other material may be used as long as it can tracking changes in the height of the thermoelectric conversion elements 5, 6 an transmit the biasing force of the springs 15 to each of the thermoelectric conversion elements 5, 6 individually.

Figure 3:
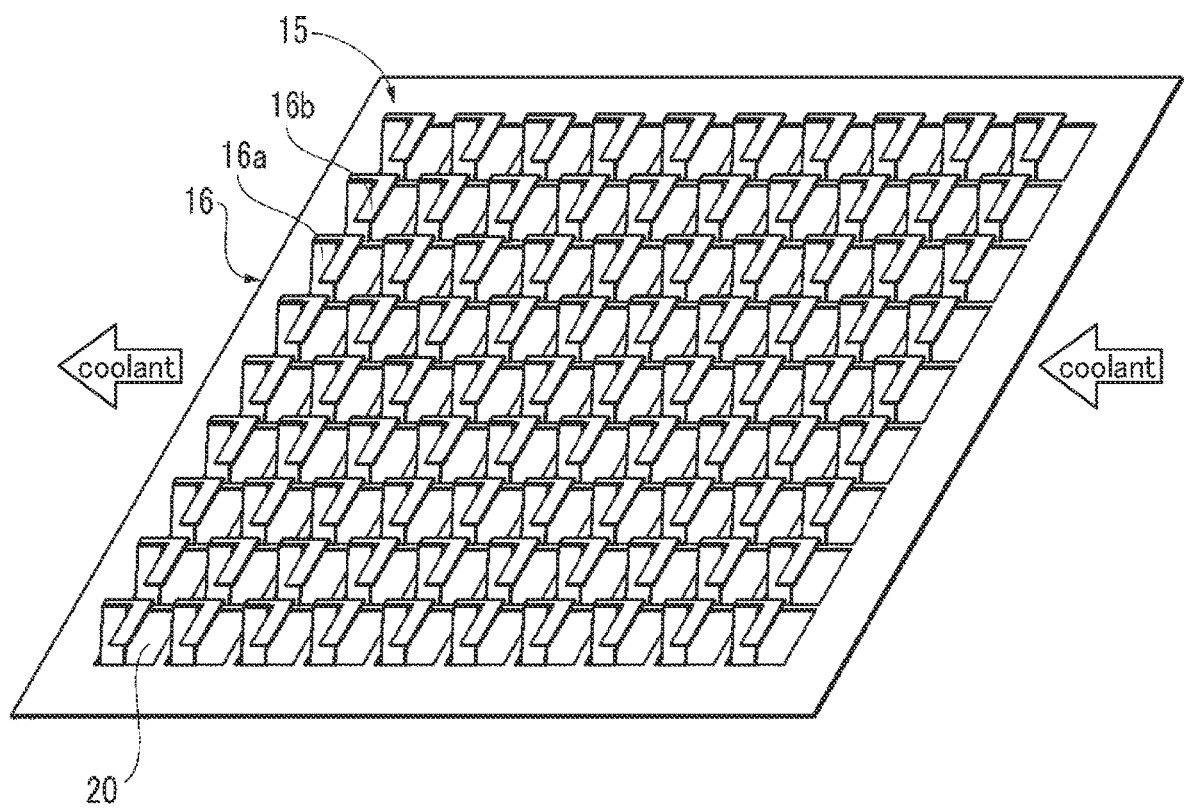
FIG. 3 is a perspective view illustrating a plurality of springs of the embodiment.

As shown in FIG. 3, the springs 15 are formed in a Z-shaped cross-section by cutting and raising a single metal plate 16 at positions corresponding to the thermoelectric conversion elements 5, 6. Arrows indicate the direction in which the coolant flows. By forming a plurality of springs 15 from a single metal plate 16 by cutting and raising, it is not necessary to position each spring at every one of the thermoelectric conversion elements 5, 6, thereby facilitating assembly.

The springs 15 are constructed of an inclined portion 16a cut and raised from a single metal plate and extending upward at an angle, and a pressing portion 16b, connected to the tip of the inclined portion 16a and extending parallel to one metal plate 16, that presses the thermoelectric conversion elements 5, 6 via the transfer portion 14, the insulator 9, and the second electrode 8. The insulator 9 fixed to the second electrode 8 by brazing is neither brazed to the transfer portion 14 nor fixed to the transfer portion 14.

Thus, the second electrode 8 side of the thermoelectric conversion elements 5, 6 is biased by the biasing force of the springs 15 and are is only in contact with the transfer portion 14, such that, even when the thermoelectric conversion elements 5, 6 deform due to thermal expansion, the cold-side heat exchanger 3 side of the thermoelectric conversion elements 5, 6 is a free end and can prevent the thermoelectric conversion elements 5, 6 from being subjected to excessive force due to stress concentration or the like. The springs 15 are disposed in the cold-side heat exchanger 3 so that the plate thickness direction of the inclined portion 16a and the pressing portion 16b is orthogonal to the direction in which the coolant flows through the cold-side heat exchanger 3, thereby preventing the plurality of springs 15 from becoming an impediment to the flow of coolant as the cold medium.

Further, since the springs 15 are disposed in the cold-side heat exchanger 3, the springs 15 themselves also function as cooling fins, so that it is easy to maintain a temperature differential between both ends of the thermoelectric conversion elements 5, 6, the number of components can be reduced as compared with a case in which the springs and the cooling fins are separately provided, and the thermoelectric conversion device 1 can be made compact.

Figure 4:
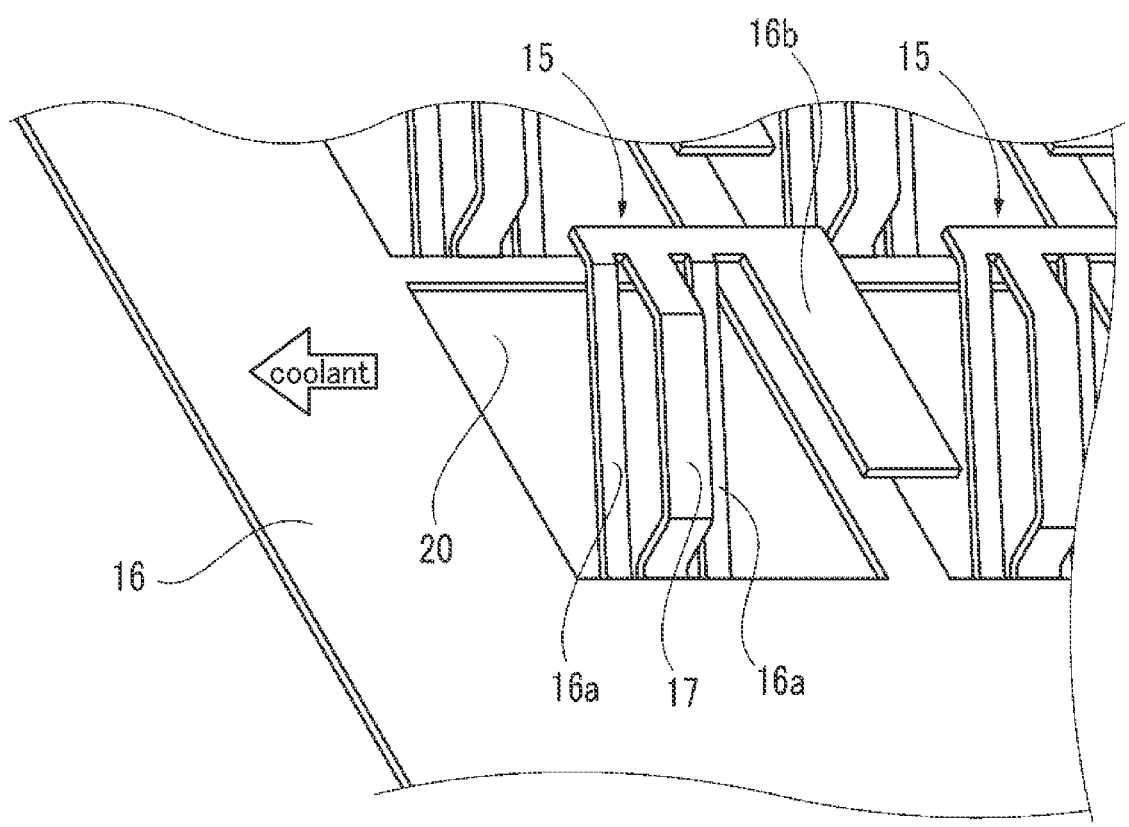
FIG. 4 is a perspective view illustrating a shape of a spring according to another embodiment.

The shape of the springs 15 is not limited to that illustrated in FIG. 3. For example, as shown as another embodiment in FIG. 4, it is also possible to provide, in the inclined portion 16a in the center of the Z shape, a projection 17 having a trapezoidal cross-section and projecting so as to be further cut upward, and form the springs 15 so that the projection 17 increases the surface area of the springs 15. With the springs 15 of FIG. 4, it is possible to provide springs with good thermal conductivity (heat dissipation).

Provided that it can provide a predetermined biasing force and does not significantly impede the flow of the cold medium, the shape of springs 15 can be anything other than a Z shape.

The actual heights of individual thermoelectric conversion elements 5, 6 including the electrodes 7, 8 may differ from each other due to differences in thermal expansion coefficient caused by differences in the material of the thermoelectric conversion elements such as a n-type or p-type, unevenness in the height of the thermoelectric conversion elements 5, 6 due to differences in the thickness of the brazing during brazing of the electrodes 7, 8 to the thermoelectric conversion elements 5, 6, differences in the thermal expansion of the thermoelectric conversion elements 5, 6, the temperature differential between the upstream and downstream flows of the hot medium, differences in surface roughness between the conversion elements 5, 6, and the like. In the conventional thermoelectric conversion module, there is a risk that the conversion from thermal energy to electrical energy is performed in only some of the thermoelectric conversion elements whose actual height is high, and in other thermoelectric conversion elements, proper conversion is not performed.

In contrast, with the thermoelectric conversion device 1 of the present embodiment, one spring 15 biases and presses one thermoelectric conversion element 5, 6, so the thermoelectric conversion element 5, 6 is firmly connected to the hot-side heat exchanger 2 and the cold-side heat exchanger 3 through the electrodes 7, 8, the insulator 9, the transfer portion 14, and the metal plate 10 while the springs 15 absorb any unevenness in the heights of the thermoelectric conversion elements 5, 6 due to differences in thermal expansion or brazing to enable electric power to be efficiently extracted from thermal energy.

Further, a plurality of springs 15 can be configured by cutting and raising from a single metal plate 16, thereby eliminating the need to position one of the springs 15 at each of the thermoelectric conversion element 5, 6 and thus facilitating the manufacture of the thermoelectric conversion device 1.

In the present embodiment, the "one exchanger" is the cold-side heat exchanger 3 and the springs 15 are disposed in the cold-side heat exchanger 3. If the springs 15 were to be disposed in the hot-side heat exchanger 2, then because a hot medium flows through the hot-side heat exchanger 2, depending on the temperature of the flowing medium (exhaust gas) and the material of the springs 15 there is a risk that the proper spring characteristics may not be obtained and the thermoelectric conversion elements 5, 6 may not be able to be firmly biased by the springs 15. Therefore, if the "one exchanger" is the cold-side heat exchanger 3 and the plurality of springs 15 is arranged in the cold-side heat exchanger 3 as in the present embodiment, the springs 15 do not contact the hot medium and the proper biasing force can be applied to the thermoelectric conversion elements 5, 6.

In the present embodiment, a so-called π-type thermoelectric conversion module using both n-type and p-type thermoelectric conversion elements has been described. However, the thermoelectric conversion elements of the present disclosure are not limited to a so-called π-type thermoelectric conversion module. For example, the thermoelectric conversion module can be a so-called unileg-type thermoelectric conversion module configured of only n-type thermoelectric conversion elements and connecting adjacent n-type thermoelectric conversion elements to the first electrode and the second electrode by a connecting member and still provide the advantages of the present disclosure.

Further, although the corrugated fins 11 are provided inside in the hot-side heat exchanger 2 of the present embodiment as heat conductivity improvement members, the heat conductivity improvement members are not limited to the corrugated fins 11.

Numerous additional modifications and variations are possible in light of the above teachings. It is therefore to be understood that, within the scope of the above teachings, the present disclosure may be practiced otherwise than as specifically described herein. With some embodiments having thus been described, it is obvious that the same may be varied in many ways. Such variations are not to be regarded as a departure from the scope of the present disclosure and appended claims, and all such modifications are intended to be included within the scope of the present disclosure and appended claims.

EXPLANATION OF REFERENCE NUMERALS

1 Thermoelectric conversion device
2 Hot-side heat exchanger
2a Hot medium supply port
2b Hot medium discharge port
3 Cold-side heat exchanger
3a Cold medium supply port
3b Cold medium discharge port
4 Thermoelectric conversion module
5 n-type thermoelectric conversion element
6 p-type thermoelectric conversion element
7 First electrode
7a Bent portion
8 Second electrode
8a Bent portion
9 Insulator
10 Metal plate
11 Corrugated fin
12 Metal plate
13 Notch hole
14 Transfer portion
15 Spring
16 Metal plate
16a Inclined portion
16b Press portion
17 Projection

What is claimed is:

1. A thermoelectric conversion device comprising:
a plurality of first electrodes;
a plurality of thermoelectric conversion elements, each having one end electrically connected to each of the first electrodes;
a plurality of second electrodes, to which another end of each of the thermoelectric conversion elements is electrically connected;
a hot-side heat exchanger connected to the first electrodes; and
a cold-side heat exchanger connected to the second electrodes via a plate-shaped insulator to which the second electrodes are not fixed, the cold-side heat exchanger consisting of two metal plates placed parallel to and facing each other with a space therebetween,
wherein a plurality of springs is disposed in an interior of the cold-side heat exchanger at portions connected to the second electrodes, such that one spring is disposed so as to bias one thermoelectric conversion element,
the cold-side heat exchanger is provided with a transfer portion capable of transmitting to one thermoelectric conversion element a biasing force of one spring at a portion connected to the first electrode or the second electrode,
the transfer portion being a metal foil having a thickness thinner than a thickness of either one of the plates of the cold-side heat exchanger,
a side of the thermoelectric conversion elements nearest the cold-side heat exchanger forming a free end in contact with only the transfer portion, and
each spring of the plurality of springs has a Z-shaped cross-section formed by cutting and raising a single metal plate at a plurality of positions corresponding to the thermoelectric conversion elements,
each spring of the plurality of springs having an inclined portion extending upward at an angle to the single metal plate and a pressing portion continuous with the inclined portion and extending parallel to the single metal plate.

2. The thermoelectric conversion device according to claim 1, wherein the plurality of springs cut and raised from one metal plate is disposed inside the one exchanger so that a plate thickness direction of the plurality of springs is orthogonal to a direction of flow of a medium through the one exchanger.

3. The thermoelectric conversion device according to claim 1, wherein each spring of the plurality of springs further includes a projection formed in the inclined portion, the projection having a trapezoidal cross-section and projecting outward and upward from the inclined portion.

\* \* \* \* \*